(12) United States Patent
Kim

(10) Patent No.: US 10,661,542 B2
(45) Date of Patent: May 26, 2020

(54) METHOD FOR TRANSFERRING GRAPHENE

(71) Applicant: CHARMGRAPHENE CO., LTD., Suwon-si, Gyeonggi-do (KR)

(72) Inventor: Yong Ki Kim, Hwaseong-si (KR)

(73) Assignee: CHARMGRAPHENE CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/072,758

(22) PCT Filed: Jun. 23, 2016

(86) PCT No.: PCT/KR2016/006683
§ 371 (c)(1),
(2) Date: Jul. 25, 2018

(87) PCT Pub. No.: WO2017/131302
PCT Pub. Date: Aug. 3, 2017

(65) Prior Publication Data
US 2019/0061328 A1    Feb. 28, 2019

(30) Foreign Application Priority Data

Jan. 28, 2016 (KR) ........................ 10-2016-0010400

(51) Int. Cl.
| | |
|---|---|
| *B32B 37/00* | (2006.01) |
| *B32B 38/00* | (2006.01) |
| *C23F 1/00* | (2006.01) |
| *B65H 37/04* | (2006.01) |
| *C23F 1/02* | (2006.01) |
| *B65H 41/00* | (2006.01) |

(Continued)

(52) U.S. Cl.
CPC ............ *B32B 37/025* (2013.01); *B32B 9/007* (2013.01); *B65H 18/08* (2013.01); *B65H 37/04* (2013.01); *B65H 41/00* (2013.01); *C23F 1/02* (2013.01); *C23F 1/08* (2013.01); *B32B 38/10* (2013.01); *B32B 2313/04* (2013.01); *B82Y 40/00* (2013.01); *H01L 29/1606* (2013.01)

(58) Field of Classification Search
None
See application file for complete search history.

(56) References Cited

U.S. PATENT DOCUMENTS

| | | | |
|---|---|---|---|
| 2014/0037963 A1 | 2/2014 | Song | |
| 2015/0314579 A1* | 11/2015 | Hong | B32B 37/24 156/249 |
| 2017/0057812 A1* | 3/2017 | Zurutuza Elorza | B81C 1/00158 |

FOREIGN PATENT DOCUMENTS

| | | |
|---|---|---|
| KR | 10-2012-0111659 A | 10/2012 |
| KR | 10-1429518 B1 | 8/2014 |

(Continued)

*Primary Examiner* — Shamim Ahmed
(74) *Attorney, Agent, or Firm* — Rabin & Berdo, P.C.

(57) ABSTRACT

A method for transferring graphene according to an exemplary embodiment of the present invention includes a process of transferring graphene of a metal sheet onto a thermal release film in each vacuum chamber and a process of transferring the graphene of the thermal release film onto a base material substrate. According to the method for transferring graphene, adhesion is increased by removing bubbles or foreign substances at the time of transferring the graphene to prevent separation of the graphene at the time of etching a metal substrate and enhance an adhesive quality state of the graphene on a target substrate.

1 Claim, 2 Drawing Sheets

(51) Int. Cl.
  *B65H 18/08* (2006.01)
  *B32B 9/00* (2006.01)
  *C23F 1/08* (2006.01)
  *B82Y 40/00* (2011.01)
  *H01L 29/16* (2006.01)
  *B32B 38/10* (2006.01)

(56) References Cited

FOREIGN PATENT DOCUMENTS

KR  10-2015-0128370 A  11/2015
WO  WO-2014-123319 A1  8/2014
WO  WO-2015-102459 A1  7/2015

* cited by examiner

METHOD FOR TRANSFERRING GRAPHENE

TECHNICAL FIELD

The present invention relates to a method for transferring graphene, and more particularly, to a method for transferring graphene capable of forming a shape of an object by laminating materials.

BACKGROUND ART

Generally, graphene is a material with a honeycomb structure of an atomic size made of carbon atoms and may be made of raw materials containing carbon atoms such as graphite, carbon dioxide, ethanol, and methane and is a material having the most excellent characteristic among exiting materials.

The graphene has a small thickness of 0.2 nm, has high transparency, and may transfer 100 times more current than copper at room temperature 100 times faster than silicon. The graphene is more than twice higher than diamond with the highest thermal conductivity.

The graphene is more than 200 times stronger in mechanical strength than steel, but does not lose its electrical conductivity due to good elasticity even when being stretched or folded. Because of these excellent characteristics, the graphene is a next-generation material that can be applied to wearable computers as well as flexible displays and transparent computers, which are in the limelight as a future technology.

The most notable feature is that when electrons move on the graphene, electrons flows as if the mass is zero, which means that the electrons flow at a moving speed of light in the vacuum, that is, a luminous flux. The grapheme has an abnormal half-integer quantum hall effect on electrons and holes.

Such graphene may be fabricated mainly using a chemical vapor deposition process. That is, high-quality graphene may be mass-produced by the chemical vapor deposition method. The graphene may be deposited on a silicon wafer substrate or a metal substrate on which a metal catalyst layer is formed. As such, the graphene deposited on the substrate may be transferred and used onto a substrate made of a desired material.

A general method for transferring graphene has used a method of transferring graphene on a metal substrate onto a desired substrate by using a thermal release film in the air. At this time, a metal substrate, that is, a metal layer on the back surface of the graphene transferred onto the thermal release film is removed by a wet etching process. Thereafter, the graphene transferred onto the thermal release film may be transferred onto a target substrate by applying heat to the thermal release film.

However, when a series of transfer processes using the thermal release film is performed in the atmosphere, bubbles are generated between the thermal release film and the graphene, and between the graphene and the target object. At this time, the bubbles between the thermal release film and the graphene cause a phenomenon that the graphene is separated together when the metal substrate is etched, and the bubbles between the graphene and the target object impede the adhesion between the graphene and the target substrate to suppress the graphene from being completely transferred to the target substrate.

When bubbles or foreign substances are interposed between the graphene and the thermal release film or between the graphene and the target substrate in this way, the adhesion due to the transfer decreases and the quality of the graphene deteriorates.

DISCLOSURE

Technical Problem

An object of the present invention is to provide a method for transferring graphene capable of increasing adhesion by removing bubbles or foreign substances at the time of transferring the graphene, preventing separation of the graphene at the time of etching a metal substrate, and enhancing an adhesive quality state of the graphene on a target substrate.

Technical Solution

According to an exemplary embodiment of the present invention for achieving the objects of the present invention, there is provided a method for transferring graphene including: passing a metal sheet having graphene on one surface and a protective film on the graphene and a transfer receiving sheet having a protective film on one surface through respective inlet rollers in an outlet of a vacuum chamber made in a vacuum atmosphere to remove the protective films and then conveying the metal sheet and the transfer receiving sheet to an outlet of a vacuum chamber; adhering and transferring the graphene to one surface of the transfer receiving sheet by contacting one surface of the transfer receiving sheet with the graphene of the metal sheet by outlet rollers in the outlet of the vacuum chamber and discharging the graphene to the outlet of the vacuum chamber; and removing the metal sheet from the transfer receiving sheet by passing the metal sheet bonded to the transfer receiving sheet adhered with the graphene through an etching solution.

At least one of heat and pressure may be applied to the transfer onto the transfer receiving sheet of the graphene and a base material film which is directly transferred with the graphene through thermocompression may be used as the transfer receiving sheet.

The vacuum chamber may be a first vacuum chamber, at least one of heat and pressure may be applied to the transfer of the graphene onto the transfer receiving sheet, and a thermal release film may be used as the transfer receiving sheet.

The method for transferring graphene may further include supplying the thermal release film adhered with the graphene and the base material film to be adhered with the graphene to the inside of the second vacuum chamber made in the vacuum atmosphere and then conveying the supplied thermal release film and base material film to the outlet of the second vacuum chamber; and separating the graphene from the thermal release film by contacting the graphene of the thermal release film and the base material film by the outlet rollers in the outlet of the second vacuum chamber and transferring the graphene to the base material film.

In the method for transferring graphene, the metal sheet having the graphene and the thermal release film may be provided in a roll form attached with the protective sheet, and the protective films of the metal sheet and the thermal release film may be separated from each other while passing through the separation rollers to be discharged to the inlet side of the vacuum chamber.

In the method for transferring graphene, while the thermal release film and the metal sheet bonded pass through an etching vessel containing an etching solution, the metal sheet may be etched to be removed, and the metal sheet may be guided to the etching vessel by the first etching guiding roller on the upper portion of the etching vessel, guided to the upper portion of the etching vessel by the etching roller in the etching vessel, and guided and conveyed to a winding roller wound with the thermal release film having only the remaining graphene by the second etching guiding roller which is disposed to be spaced apart from the first etch guiding roller.

In the method for transferring graphene, a vacuum curtain may be provided to provide vacuum pressure between at least one of the inlet rollers and the outlet rollers and the vacuum chamber to prevent gas from flowing into the vacuum chamber.

In the method for transferring graphene, grooves may be provided on the wall portion of the vacuum chamber so that at least one of the inlet rollers and the outlet rollers is inserted and rotated.

In the method for transferring graphene, a polymer layer, which is mutually contacted and deformable, may be coated on at least one of the inlet rollers and the outlet rollers to remove a gap between the rollers by the passing film or sheet.

Advantageous Effects

According to the exemplary embodiment of the present invention, it is possible to increase adhesion by removing bubbles or foreign substances at the time of transferring the graphene, prevent separation of the graphene at the time of etching a metal substrate, and enhance an adhesive quality state of the graphene on a target substrate.

BEST MODE OF THE INVENTION

Figure 1:
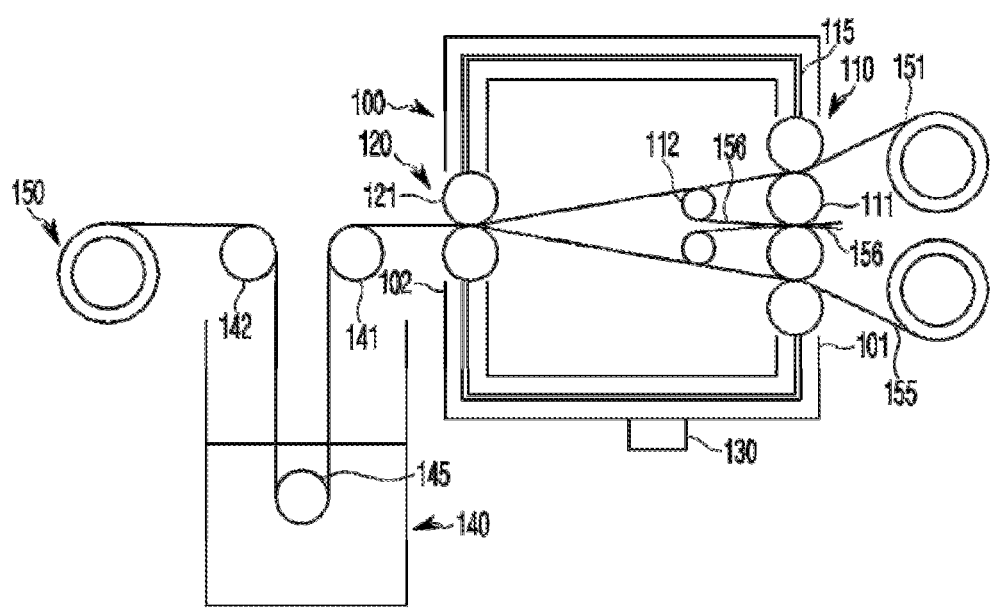
FIG. 1 is a schematic diagram of a first vacuum chamber in which a thermal release film and a metal sheet are bonded to each other in a graphene transfer process according to an exemplary embodiment of the present invention.

A best aspect of the present invention provides a method for transferring graphene including: passing a metal sheet having graphene on one surface and a protective film on the graphene and a transfer receiving sheet having a protective film on one surface through respective inlet rollers in an outlet of a vacuum chamber made in a vacuum atmosphere to remove the protective films by the inlet rollers and then conveying the metal sheet and the transfer receiving sheet to an outlet of a vacuum chamber; adhering and transferring the graphene to one surface of the transfer receiving sheet by contacting one surface of the transfer receiving sheet with the graphene of the metal sheet by outlet rollers in the outlet of the vacuum chamber and discharging the graphene to the outlet of the vacuum chamber; and removing the metal sheet from the transfer receiving sheet by passing the metal sheet bonded to the transfer receiving sheet adhered with the graphene through an etching solution.

Modes of the Invention

Various exemplary embodiments of the present invention will now be described by specific embodiments shown in the accompanying drawings. It should be understood that differences from exemplary embodiments of the present invention to be described below are not mutually exclusive. That is, it should be understood that specific shapes, structures, and characteristics described may be implemented in other exemplary embodiments in accordance with one exemplary embodiment without departing from the spirit and scope of the present invention, and the positions or displacement of respective components in each disclosed exemplary embodiment the present invention may be modified. In the drawings, like reference numerals refer to the same or similar functions throughout various aspects, and lengths and areas, thicknesses, and the like, and shapes thereof may be exaggerated for convenience.

The method for transferring the graphene is to transfer graphene of a metal sheet used as a metal catalyst onto a transfer receiving sheet in a vacuum chamber. When a thermal release film is used as the transfer receiving sheet, a subsequent process of separating the thermal release film and re-transferring the graphene to a base material film in another vacuum chamber may be performed. In addition, when the base material film is directly used as the transfer receiving sheet, the substrate transferred with the graphene may be fabricated by a single transfer process.

Figure 2:
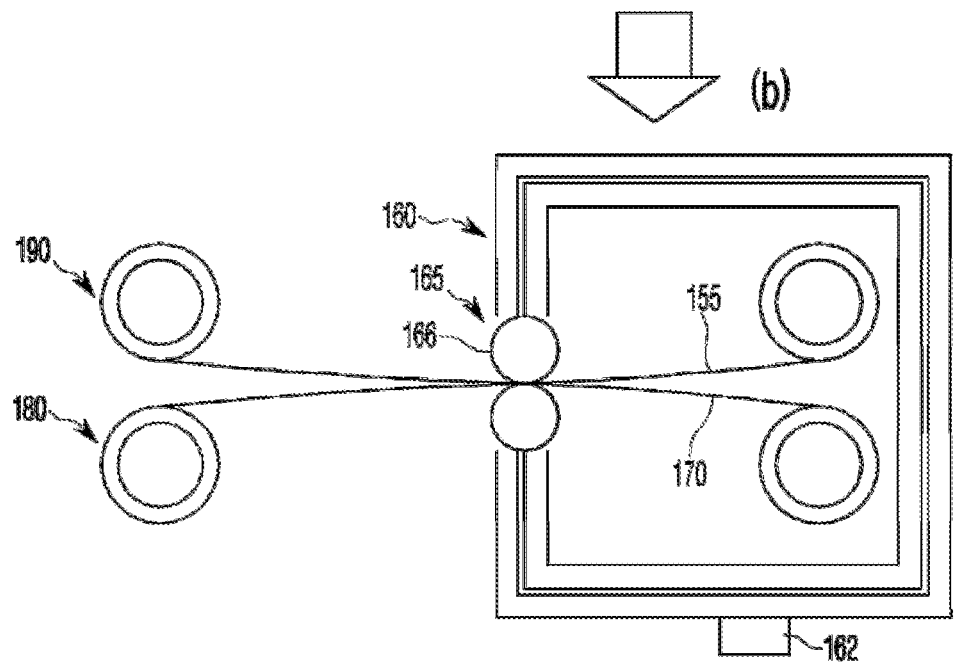
FIG. 2 is a schematic diagram of a second vacuum chamber in which graphene on the thermal release film is transferred onto a base material film in the graphene transfer process according to the exemplary embodiment of the present invention.

As shown in FIGS. 1 and 2, a method of transferring graphene according to an exemplary embodiment of the present invention includes a step (a) of transferring graphene of a metal sheet 151 to a thermal release film 155 and a step (b) of transferring the graphene of the thermal release film 155 to the base material substrate. At this time, the thermal release film is used as the transfer receiving sheet of the graphene.

Among them, the step of transferring the graphene of the metal sheet 151 onto the thermal release film 155 is performed in a first vacuum chamber 100 to which a vacuum pumping line 130 is connected. The first vacuum chamber 100 is provided with rollers 110 and 120 at an inlet 101 and an outlet 102, respectively.

The inlet rollers 110 of the inlet 101 are vertically arranged and are provided with four introduction rollers 111 for introducing the metal sheet 151 and the thermal release film 155 into the inside of the vacuum chamber 100 and two separation rollers 112 which are disposed inside the vacuum chamber 100 to separate protective films 151 and 155 of the metal sheet 151 and the thermal release film 155 from each other.

In addition, the outlet rollers 120 at the outlet 102 of the vacuum chamber 100 are two adhering rollers 121 for adhering the thermal release film 155 to the graphene of the metal sheet 151. A vacuum pumping line 130 may be connected to the lower portion of the vacuum chamber 100 to provide a vacuum pressure.

A vacuum curtain line 115 may be connected to the inlet 101 and the outlet 102 to prevent external gas from flowing into the vacuum chamber 100 through the rollers 111 and 121. Such a vacuum curtain line 115 may be provided in a wall portion of the vacuum chamber 100. The vacuum chamber 100 configured above is defined as the first vacuum chamber 100. The graphene is not shown, but is assumed to be on the bottom surface of the metal sheet 151. The metal sheet 151 may mainly use a metal foil on which the graphene is deposited.

First, as shown in FIG. 1, the step (a) of transferring the graphene of the metal sheet 151 onto the thermal release film 155 will be described.

The method of transferring the graphene according to the exemplary embodiment of the present invention using the first vacuum chamber 100 as described above includes passing the metal sheet 151 having graphene on one surface and the protective film 156 on the graphene and the thermal release film 155 having the protective film 156 on one surface through respective inlet rollers 110 in the inlet 101 of the first vacuum chamber 100 made in a vacuum atmosphere to remove the protective films 156 by the inlet rollers 110 and then conveying the metal sheet and the thermal transfer film to the outlet 102 of the first vacuum chamber 100; and adhering the graphene to one surface of the thermal release film 155 by contacting one surface of the thermal release film 155 with the graphene of the metal sheet 151 by the outlet rollers 120 in the outlet 102 of the first vacuum chamber 100 and discharging the graphene to the outlet 102 of the first vacuum chamber 100. The graphene may be transferred to the upper surface of the thermal release film 155 and disposed on the thermal release film 155.

At this time, the metal sheet 151 and the thermal release film 155 are introduced into the first vacuum chamber 100 by the introduction rollers 111 and the protective film 156 is wound on the separation rollers 112, and the protective film 156 is separated, and the protective film 156 is conveyed between the separation rollers 112 to be discharged to the outside of the inlet 101 side.

The metal sheet 151 and the thermal release film 155, which are vertically in contact with the separation rollers 112 and conveyed to the outlet 102, are bonded to each other while passing between the adhering rollers 121. At this time, the graphene of the metal sheet 151 is adhered to the one side of the thermal release film 155 on which the protective film 156 has been placed, and is transferred to the thermal release film 155 side. Thereafter, the metal sheet 151 and the thermal release film 155 are conveyed to an etching vessel 140 in a bonded state.

The etching of the metal sheet 151 may be performed while the etching vessel 140, two etching guiding rollers 141 and 142 provided on the etching vessel 140, and the metal sheet 151 and the thermal release film 155 bonded by the etching roller 145 disposed in the etching vessel 140 are conveyed.

The metal sheet 151 is removed from the thermal release film 155 by passing the metal sheet 151 bonded with the thermal release film 155 adhered with the graphene through the etching solution by using the etching vessel 140 as described above. At this time, an etching solution capable of removing the metal sheet 151 is stored in the etching vessel 140. For example, when the metal sheet 151 is a copper foil, an iron nitrate solution may be used as the etching solution.

As described above, in the process of transferring the graphene according to the exemplary embodiment of the present invention, the metal sheet 151 and the thermal release film 155 are provided in a roll form attached with the protective sheet 156, and the protective films 156 of the metal sheet 151 and the thermal release film 155 are separated from each other while passing through the separation rollers 112 among the inlet rollers 110 to be discharged to the inlet 101 side of the vacuum chamber 100.

In addition, while the thermal release film 155 and the metal sheet 151 bonded pass through the etching vessel 140 containing the etching solution, the metal sheet 151 is etched to be removed. At this time, the metal sheet 151 may be guided to the etching vessel 140 by the first etching guiding roller 141 on the upper portion of the etching vessel 140, guided to the upper portion of the etching vessel 140 by the etching roller 145 in the etching vessel 140, and guided and conveyed to a winding roller 150 wound with the thermal release film 155 having only the remaining graphene by the second etching guiding roller 142 which is disposed to be spaced apart from the first etch guiding roller 141. At this time, while the winding roller 150 is driven to rotate, the metal sheet 151 and the thermal release film 155 may be conveyed through the first vacuum chamber 100.

Next, the step (b) of transferring the graphene of the thermal release film 155 onto the base material substrate, that is, the base material film 170 according to the exemplary embodiment of the present invention will be described with reference to FIG. 2.

According to the exemplary embodiment of the present invention, the metal sheet 151 is etched and removed, and the thermal release film 155 of which the graphene remains on the surface is supplied to the second vacuum chamber 160 for transferring onto the base material film 170.

At this time, the thermal release film 155 may be supplied in the form of a wound roll. The inside of the second vacuum chamber 160 is constituted so that the thermal release film 155 and the base material film 170 may be disposed in the roll form, and the transferring roller 166 capable of bonding the graphene of the thermal release film 155 to the base material film 170 is disposed in the outlet 102. Of course, since the second vacuum chamber 160 is not limited to this configuration, the supply position of the thermal release film 155 and the base material film 170 is not limited to the inside of the second vacuum chamber 160. That is, the thermal release film 155 may be supplied to the inside through the inlet in the same manner as the first vacuum chamber 100, with the base film 170 disposed in the form of a roll. To this end, the second vacuum chamber 160 may be provided with the inlet and the rollers.

The step (b) of transferring the graphene of the thermal release film 155 to the base material film 170 includes supplying the base material film 170 to be bonded with the thermal release film 155 bonded and transferred with the graphene to the inside of the second vacuum chamber 160 made in a vacuum atmosphere and then conveying the supplied base material film 170 to the outlet 161 of the second vacuum chamber 160, and separating the graphene from the thermal release film 155 by adhering the graphene of the thermal release film 155 and the base material film by the outlet rollers 160 in the outlet 161 of the second vacuum chamber 160 and transferring the graphene to the base material film 170.

At this time, the outlet rollers 120 of the second vacuum chamber 160 may be heated to alleviate the adhesion between the graphene and the thermal release film 155, and the graphene of the thermal release film 155 may be transferred onto the base material film 170 and simultaneously, the thermal release film 155 may be easily separated from the graphene. That is, on the side of the outlet rollers 160, an ultraviolet module for heating may be provided. Thus, the graphene of the thermal release film 155 may be smoothly transferred onto the base material film 170. A PET film may be used as the base material film 170, but is not limited thereto. That is, since the base material film 170 is provided in a roll manner, a flexible PET film is used, but it is sufficient as long as a material that may be used as a substrate for graphene.

The base material film 170 transferred with the graphene above is wound on a film winding roll 180 spaced apart from the second vacuum chamber 160 and the thermal release film 155 is collected to a film collecting roll 190. For example, the base material film 170 may form electrodes in various patterns on the graphene and can be used as a thin electrode film.

The film winding roll 180 and the film collecting roll 190 may be disposed inside the second vacuum chamber 160 or at least only the film winding roll 180 may be disposed inside the second vacuum chamber 160 to prevent the base material film 170 transferred with the graphene from being in contact with foreign substances and external gas. However, in this case, since the size of the second vacuum chamber 160 needs to be expanded, it takes more time to make a vacuum atmosphere.

In the process of transferring the graphene according to the exemplary embodiment of the present invention, the adhesion may be increased by removing bubbles or foreign substances at the time of transferring the graphene, thereby preventing separation of the graphene at the time of etching the metal substrate and enhancing an adhesive quality state of the graphene on the target substrate. Furthermore, by providing the vacuum curtain to the side of the rollers for introducing or discharging the films or sheets into or from the vacuum chambers, it is possible to prevent the foreign substances and the gas from flowing into the vacuum chambers, thereby preventing the bubbles and the foreign substances which may occur at the time of transferring the graphene from being interposed in advance.

Figure 3:
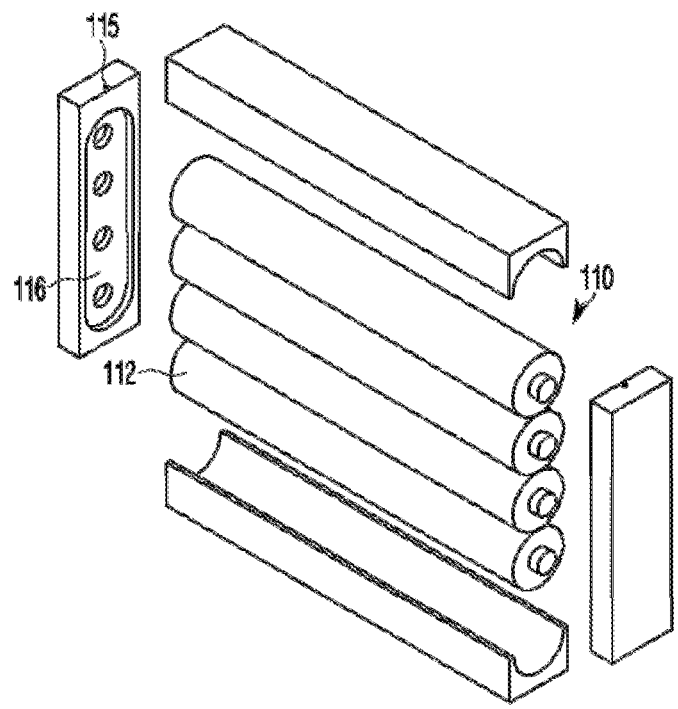
FIG. 3 is a schematic diagram of an inlet roller of FIG. 1.

Meanwhile, referring to FIGS. 1 to 3, in the process of transferring the graphene according to the exemplary embodiment of the present invention, the vacuum curtain is provided to provide vacuum pressure between the inlet rollers 110 and the outlet rollers 120 of the first vacuum chamber 100 and between the outlet rollers 165 of the second vacuum chamber 160 and the vacuum chamber 160, thereby preventing the gas from flowing into the vacuum chamber 160. In FIG. 3, an installation structure of the introducing rollers 112 among the inlet rollers 100 of the first vacuum chamber 100 is shown. It is assumed that the installation structure of the introduction rollers 112 is applied to the outlet rollers 120 and 165. The vacuum curtain may block gases and foreign substances from flowing between the rollers when each film or sheet passes through the rollers. That is, the external gas that can flow into the vacuum chamber 160 is sucked into a vacuum curtain line 115, which provides the vacuum curtain.

On the other hand, a polymer curtain may be used as a structure for blocking gases and foreign substances from being flowing between the rollers. The polymer may be provided to be coated on the roller as described below, but may be provided as a seal to the roller as a curtain structure.

Figure 4:
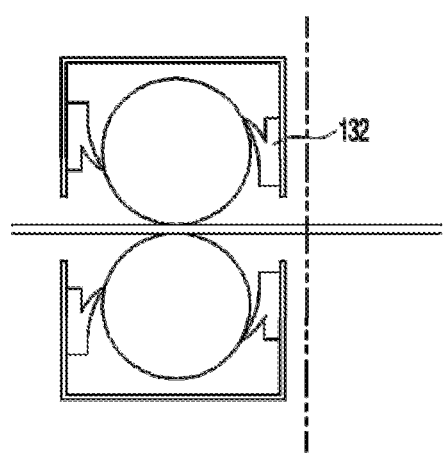
FIG. 4 is a schematic diagram of a roller seal used in the graphene transfer process according to the exemplary embodiment of the present invention.

For example, as shown in FIG. 4, the polymer curtain may be provided and arranged as a roller seal 132 as a curtain structure in contact with the rollers at the entrance sides of the rollers.

In the process of transferring the graphene according to the exemplary embodiment of the present invention, grooves 116 are provided on the wall portions of the vacuum chambers 100 and 160 so that the inlet rollers 110 and the outlet rollers 120 of the first vacuum chamber 100 and the outlet rollers 165 of the second vacuum chamber 160 are inserted and rotated, and the vacuum pressure by the vacuum curtain line 115 may be provided to the grooves 155. That is, both ends of each roller may be disposed at a cylindrical groove 116. Accordingly, it is possible to block the gases and the foreign substances from flowing between the rollers 110, 120, and 165 and the wall portions of the vacuum chambers 100 and 160.

In the process of transferring the graphene according to the exemplary embodiment of the present invention, the polymer layer 112, which is mutually contacted and deformable, is coated on the inlet rollers 110 and the outlet rollers 120 to remove a gap between the rollers by the passing film or sheet. The polymer layer 112 is a flexible material and may increase the adhesion of the rollers to an object passing between the rollers. When the objects pass, the surfaces of the rollers contacting the object are depressed, thereby preventing the occurrence of gaps between the rollers.

On the other hand, unlike the above-described exemplary embodiment of the present invention, there can be a method of transferring graphene, which can transfer graphene of a metal sheet onto a transfer receiving sheet by using only one vacuum chamber and directly use the transferred graphene as an electrode substrate. At this time, as the transfer receiving sheet, a PVC film which can transfer graphene by thermocompression bonding and be directly used as a thin flexible substrate.

A method of transferring graphene according to another exemplary embodiment of the present invention may be performed in the vacuum chamber 100 shown in FIG. 1. That is, even when the PVC film is used instead of the thermal release film 155 shown in FIG. 1, the graphene of the metal sheet 151 is directly transferred to the PVC film. At this time, when the PVC film and the metal sheet 151 are thermally compressed, the surface of the PVC film is melted and the graphene and the metal sheet 151 are fused to the melted surface of the PVC film. The metal sheet 151 bonded to the PVC film may be removed by etching. Accordingly, the PVC film transferred with graphene may be fabricated. Such a PVC film may be used as a substrate without a separate transfer process.

As a transfer receiving sheet according to another exemplary embodiment of the present invention, not only a PVC film but also a film having properties that may be used as the substrate immediately after the transfer of graphene may be used.

As described above, although the present invention has been disclosed with reference to the preferred embodiments, those skilled in the art will appreciate that various modifications, additions and substitutions are possible, without departing from the scope and spirit of the invention as disclosed in the accompanying claims.

INDUSTRIAL AVAILABILITY

The present invention relates to a method for transferring graphene and is the invention having high industrial availability which proposes a method for effectively transferring graphene as a new film from a deposited film.

The invention claimed is:
1. A method for transferring graphene comprising:
 passing
  a metal sheet having graphene on one surface and a first protective film on the graphene, and
  a transfer receiving sheet having a second protective film on one surface, through respective inlet rollers in an inlet of a vacuum chamber providing a vacuum atmosphere, to remove the first protective film and the second protective film,
 conveying the metal sheet and the transfer receiving sheet to an outlet of the vacuum chamber, adhering and transferring the graphene to the one surface of the transfer receiving sheet by contacting the one surface of the transfer receiving sheet with the graphene of the metal sheet by outlet rollers in the outlet of the vacuum chamber, discharging the graphene to the outlet of the vacuum chamber; and removing the metal sheet from the transfer receiving sheet by passing the metal sheet, the metal sheet being bonded to the transfer receiving sheet having the adhered graphene, through an etching solution;

wherein at least one of heat and pressure is applied to the transferring of the graphene onto the transfer receiving sheet, a base material film to which the graphene is directly transferred through thermocompression is used as the transfer receiving sheet, the metal sheet having the graphene, and the transfer receiving sheet, are provided in a roll form, the first protective film of the metal sheet and the second protective film of the transfer receiving sheet are separated from each other while passing through separation inlet rollers to be discharged to an inlet side of the vacuum chamber, the vacuum chamber is a first vacuum chamber, and a thermal release film is used as the transfer receiving sheet, the method further comprising:

supplying the thermal release film with the adhered graphene and the base material film, the base material film to have the graphene adhered thereto, to an inside of a second vacuum chamber providing a vacuum atmosphere, conveying the supplied thermal release film and base material film to an outlet of the second vacuum chamber, and separating the graphene from the thermal release film by contacting the graphene of the thermal release film and the base material film with outlet rollers in the outlet of the second vacuum chamber and transferring the graphene to the base material film, wherein while the thermal release film and the bonded metal sheet pass through an etching vessel containing an etching solution, the metal sheet is removed by etching, the metal sheet is
  guided to the etching vessel by a first etching guiding roller on an upper portion of the etching vessel,
  guided to the upper portion of the etching vessel by an etching roller in the etching vessel, and
  guided and conveyed to a winding roller wound with the thermal release film, the thermal release film having only remaining graphene, by a second etching guiding roller which is spaced apart from the first etching guiding roller, a vacuum curtain is provided to provide vacuum pressure between at least one of the inlet rollers and the outlet rollers and the first vacuum chamber and second vacuum chamber to prevent gas from flowing into the first vacuum chamber and second vacuum chamber, grooves are provided on a wall portion of the first vacuum chamber and second vacuum chamber so that at least one of the inlet rollers and the outlet rollers is inserted and rotated, and a deformable polymer layer is coated on at least one of the inlet rollers or the outlet rollers to remove a gap between the at least one of the inlet rollers or the outlet rollers by the passing metal film or transfer receiving sheet.

* * * * *